United States Patent [19]

Mitsutsuka et al.

[11] Patent Number: 4,900,969

[45] Date of Patent: Feb. 13, 1990

[54] SURFACE ACOUSTIC WAVE CONVOLVER

[75] Inventors: Syuichi Mitsutsuka; Takeshi Okamoto, both of Tokyo, Japan

[73] Assignee: Clarion Co., Ltd., Tokyo, Japan

[21] Appl. No.: 179,403

[22] Filed: Apr. 8, 1988

[30] Foreign Application Priority Data

Apr. 17, 1987 [JP] Japan ................................ 62-094490

[51] Int. Cl.[4] ............................................. H01L 41/08

[52] U.S. Cl. ............................ 310/313 A; 310/313 B; 310/313 D; 364/821

[58] Field of Search ................ 310/313; 364/821, 860, 364/728.1; 333/151, 153, 194, 195

[56] References Cited

U.S. PATENT DOCUMENTS 4,334,167 6/1982 Minagawa et al. ........ 310/313 D X
4,683,395 7/1987 Mitsutsuka ................. 310/313 D X
4,697,115 9/1987 Mitsutsuka ...................... 310/313 R
4,745,378 5/1988 Niitsuma et al. ........... 310/313 B X
4,748,364 5/1988 Mitsutsuka ...................... 310/313 D
4,757,226 7/1988 Mitsutsuka ...................... 364/821 X

OTHER PUBLICATIONS

Effect of Bias Field in a Zinc-Oxide-On-Silicon Acoustic Convolver, by L. A. Coldren, Applied Physics Letters, vol. 25, No. 9, Nov. 1, 1974, pp. 473–475.

*Primary Examiner*—Mark O. Budd
*Attorney, Agent, or Firm*—Flynn, Thiel, Boutell & Tanis

[57] ABSTRACT

A SAW convolver is disclosed, in which an auxiliary electrode is disposed between the gate electrode and each of two input electrodes and self convolution is reduced by applying to the auxiliary electrodes such a bias voltage that the portion of the semiconductor layer below each auxiliary electrode is inverted.

12 Claims, 4 Drawing Sheets

SURFACE ACOUSTIC WAVE CONVOLVER

FIELD OF THE INVENTION

The invention relates to a surface acoustic wave convolver (hereinbelow abbreviated to SAW convolver) and in particular to an improvement for reducing self convolution signals therein.

BACKGROUND OF THE INVENTION

FIG. 5 is a perspective view illustrating the construction of a prior art SAW convolver, in which reference numeral 1 is a piezoelectric layer; 2 is an insulating layer; 3 is a semiconductor layer; 4 is a gate electrode; 5 are input electrodes, e.g. interdigital electrodes; 6 is a rear surface electrode; 7 are input terminals and 8 is an output terminal. A convolution signal of input signals applied to the two interdigital electrodes 5 is taken out through the gate electrode 4.

The construction indicated in FIG. 5 has an advantage that the convolution efficiency of the convolver is very high.

However, in the construction indicated in FIG. 5, in addition to the convolution signal between the signals inputted in the two interdigital electrodes (hereinbelow abbreviated to I.D.T) 5, unnecessary signals called self convolution signals are produced. The self convolution signal is a signal produced by the fact that a surface wave produced by an I.D.T is reflected by the other I.D.T opposite thereto, and corresponds to a convolution signal of itself. FIG. 6 shows this aspect. It will be clearly understood from FIG. 6 that in addition to an object convolution signal $P_{out}$ between surface acoustic waves $S_1$ and $S_2$ due to input signals $P_1$ and $P_2$, other convolution signals are produced also between $S_1$ and its reflected wave $S_{1r}$ as well as $S_2$ and its reflected wave. The later two signals are self convolution signals.

Now such self convolution signals become spurious noise against the output of the convolver and have unfavorable influences thereon in that they reduce the dynamic range of the convolver. Particularly, in the conventional construction as indicated in FIG. 5, there is a drawback that these influences become remarkable, when the gate electrode 4 is short. In this regard, more in detail, refer to the following literature;

Literature [1] S. Minagawa, et al., "Efficient ZnO-$SiO_2$-Si Sezawa Wave Convolver", IEEE Trans Sonics Ultrason, vol.SU-32, No. 5, September 1985, pp670–674.

As the general method for reducing such influences of the self convolution signal, there are known e.g. a method for using a convolver having a dual gate (Literature [2]), a method, for using a unidirectional transducer (Literature [3]), etc.

Literature [2]) I. Yao, "High-performance Elastic Convolver with Parabolic Horns", Proc. 1980 IEEE Ultrason Symp., 1980 pp37–42

Literature [3] C. L. West, "SAW convolver employing unidirectional transducers for improved efficiency":, Proc. 1982, IEEE Ultrason Symp., 1982, pp119–123.

However, the former method has as a disadvantage that the area of the SAW element is large and that the external circuit connected thereto is complicated, while the latter method has as a disadvantage that the area of the SAW element is likewise large and that it is difficult to enlarge the frequency band width thereof.

OBJECT OF THE INVENTION

It is therefore an object of the invention to provide a SAW convolver capable of suppressing the self convolution signal only by adding a simple external circuit thereto without modifying significantly the construction of the prior art SAW convolver described above.

SUMMARY OF THE INVENTION

In order to achieve the above object, a SAW convolver having a pair of input electrodes and a gate electrode disposed on a multi-layered structure including at least a piezoelectric layer/a semiconductor layer or a piezoelectric layer/an insulating layer/a semiconductor layer according to this invention is characterized in that there is an auxiliary electrode disposed between the gate electrode and each of the input electrodes and that a bias voltage is applied to each auxiliary electrode so that the semiconductor layer therebelow is in the inverted state.

In an SAW convolver having the construction described above, since the semiconductor layer below the auxiliary electrode is in the inverted state, the surface acoustic waves produced by the input signals are initially only slightly attenuated, whereas the self convolution signal is reduced, because the reflected waves of the surface acoustic waves are remarkably attenuated.

DETAILED DESCRIPTION

Figure 1:
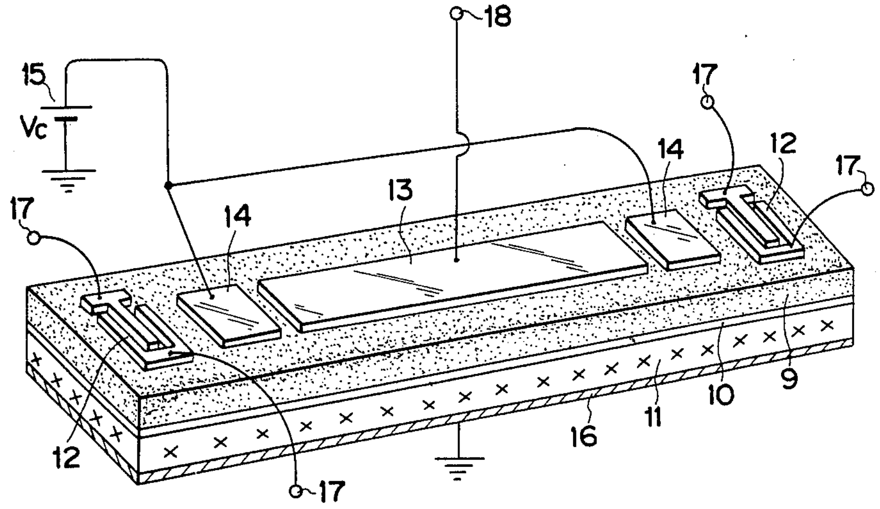
FIG. 1 is a perspective view illustrating an embodiment of this invention.

This invention will be explained below, referring to an embodiment indicated in the drawings. FIG. 1 illustrates the construction of an embodiment of a monolithic SAW convolver according to this invention. As indicated in this figure, in this embodiment, differing from the prior art construction, there are disposed two auxiliary electrodes 14 between the gate electrode 13 and the two interdigital electrodes 12 on the propagation path f of the surface acoustic wave and further a bias voltage is applied to these auxiliary electrodes from a DC bias source 15. The value of this bias voltage is so determined that electric potential of the interface portion of the semiconductor layer between the insulating layer 10 and the semiconductor layer 11 below the auxiliary electrodes 14 is inverted by said bias voltage.

The semiconductor layer 11 used for realizing this invention is not restricted to a special one. It may be either a usual bulk substrate or an epitaxially grown substrate (n/n+ substrate or p/p+ substrate), as indicated in Literature [1]. However, in order to obtain a higher convolution efficiency, it is desirable to use an epitaxially grown substrate. Further, although a multi-layered structure having an insulating layer 10 is indicated in FIG. 1, a multi-layered structure having no insulating layer may be used as well. However, from the point of view to obtain a SAW element operating stably the multi-layered structure having an insulating layer is more preferable. In FIG. 1, reference numeral 9 is a piezoelectric layer; 16 is a rear surface electrode and 18 is an output terminal.

Now the reason why the self convolution signal is suppressed in the embodiment described above will be explained. Further experimental results, which are obtained by realizing this invention in practice, will be shown.

Figure 2:
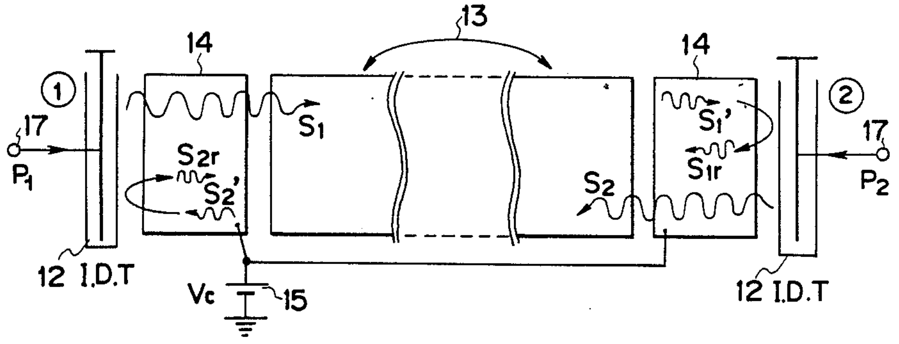
FIG. 2 is a diagram for explaining the operation of the embodiment of FIG. 1.

The self convolution is caused principally by surface acoustic waves reflected by I.D.Ts opposite to each other, as indicated in FIG. 2. Consequently, in order to suppress the self convolution signal, it is necessary to attenuate satisfactorily the intensity of the reflected waves $S_{1r}$ and $S_{2r}$ with respect to the forwarding waves $S_1$ and $S_2$.

The inventors of this invention have found that the operation described above can be realized by means of the auxiliary electrodes 14 as indicated in FIG. 1. That is, when a bias voltage to invert electrical potential of the portion of the semiconductor layer 11 below the auxiliary electrodes 14 indicated in FIG. 1, is applied thereto, the surface acoustic waves $S_1$ and $S_2$ generated by the input signals $P_1$ and $P_2$ are attenuated only slightly and on the contrary the forwarding waves $S_1'$ and $S_2'$ after having passed through the gate electrode 13 and the surface acoustic waves $S_{1r}$ and $S_{2r}$ reflected by the I.D.Ts 12 are attenuated strongly, as it is easily understood from FIG. 2. It is clear that, in such a state, the reflected waves $S_{1r}$ and $S_{2r}$ are weak satisfactorily with respect to the forwarding waves $S_1$ and $S_2$ and thus the level of the self convolution signal is lowered.

Figure 3:
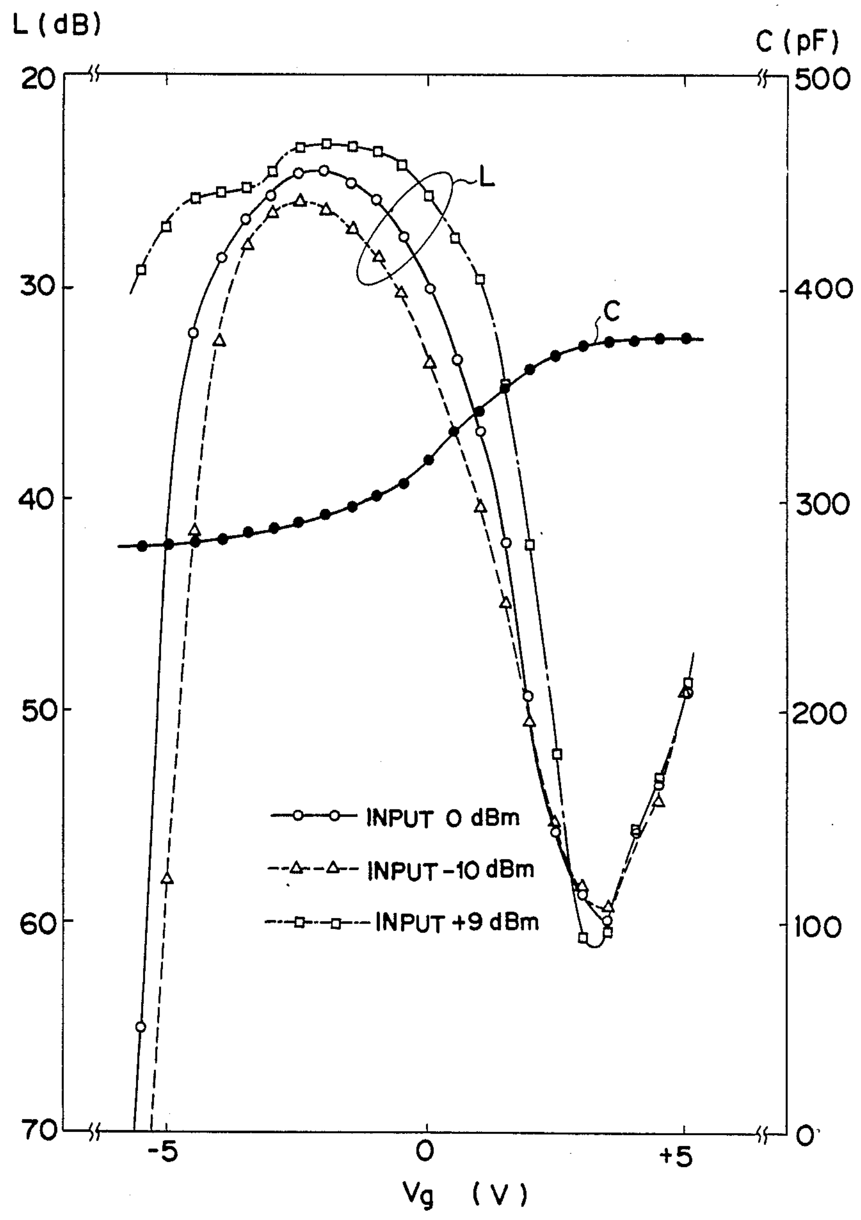
FIG. 3 is a graph showing measured characteristic curves of a prior art SAW convolver.
Figure 5:
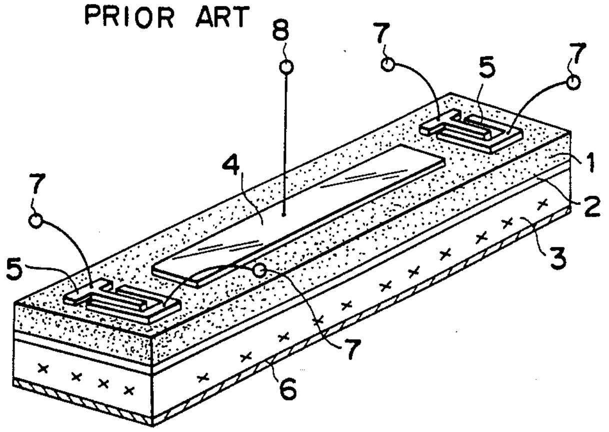
FIG. 5 PRIOR ART
FIG. 5 is a perspective view of a prior art SAW convolver.
Figure 6:
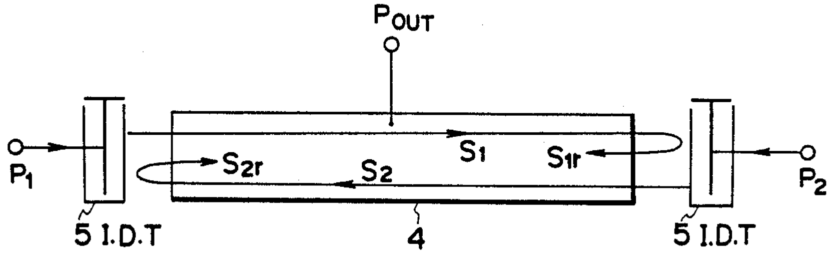
FIG. 6 PRIOR ART
FIG. 6 is a diagram for explaining the operation of the embodiment of FIG. 5.

The reason why the state indicated in FIG. 2 is realized will be explained below. The reason is that in a multi-layered structure of metal layer/piezoelectric layer/semiconductor layer the propagation loss of the surface acoustic wave propagating in the structure depends on the power of the surface acoustic wave. FIG. 3 shows experimental results obtained by measuring the insertion loss between the two interdigital electrodes (I.D.T) with respect to the voltage applied to the gate electrode in an SAW convolver having the structure indicated in FIG. 5. In FIG. 3, voltage capacity characteristics between the gate electrode and the rear surface electrode are also shown for comparison. FIG. 3 shows an example, in the case where a convolver having a multi-layered structure of $Al/ZnO/SiO_2/n\text{-}Si/n^+\text{-}Si$ and a gate 20 mm long is used (the frequency of the input signal being 215 MHz). It can be seen from FIG. 3 that the insertion loss depends on the input electric power. It is understood that in particular, when the gate voltage has such a value that electrical potential of the semiconductor layer is inverted, variations in the insertion loss, depending on the input electric power, are very great. This means that in such a state the propagation loss of the surface acoustic wave depends strongly. on the electric power. It is understood that when the power of the surface acoustic wave is great, the propagation loss is small and when the power of the surface acoustic wave is small, the propagation loss is great. Since the portion near each of the auxiliary electrodes has the same structure of metal layer/piezoelectric layer/semiconductor layer as that indicated in FIG. 5, when a bias voltage is applied to the auxiliary electrode, this gives rise to a phenomenon completely identical to that described above. That is, the propagation loss of the surface acoustic wave passing through the auxiliary electrode portion is small, when the power of the SAW is great, and on the contrary it is great, when the power of the SAW is small. At this time, when a bias voltage, which inverts electrical potential of the semiconductor layer below the auxiliary electrode, is applied thereto, variations in the propagation loss, depending on the power of SAW, are increased just as in the case indicated in FIG. 3. Since the size of the SAW element can be reduced by using the auxiliary electrode as short as possible it is desirable to apply a bias voltage inverting electrical potential of the semiconductor layer below the auxiliary electrode thereto. This is because in this state, since variations in the propagation loss depending on the power of the SAW are great, the attenuation of the surface acoustic wave passing through the auxiliary electrode portion depends on the power of the SAW greatly. For the reason stated above, attenuation of the surface acoustic wave in the auxiliary electrode portion is small, when the power thereof is great, and it is great, when the power thereof is small. On the other hand, in FIG. 2, the power of the surface acoustic waves $S_1$ and $S_2$ is great, because they have been just generated by the I.D.Ts, and the power of the surface acoustic waves $S_1'$, $S_2'$, $S_{1r}$ and $S_{2r}$ is small, because they have traversed over long distances. Consequently FIG. 2, the attenuation is small for $S_1$ and $S_2$ and it is great for $S_1'$, $S_2'$, $S_{1r}$ and $S_{2r}$. This is the fundamental principle of this invention.

Figure 4:
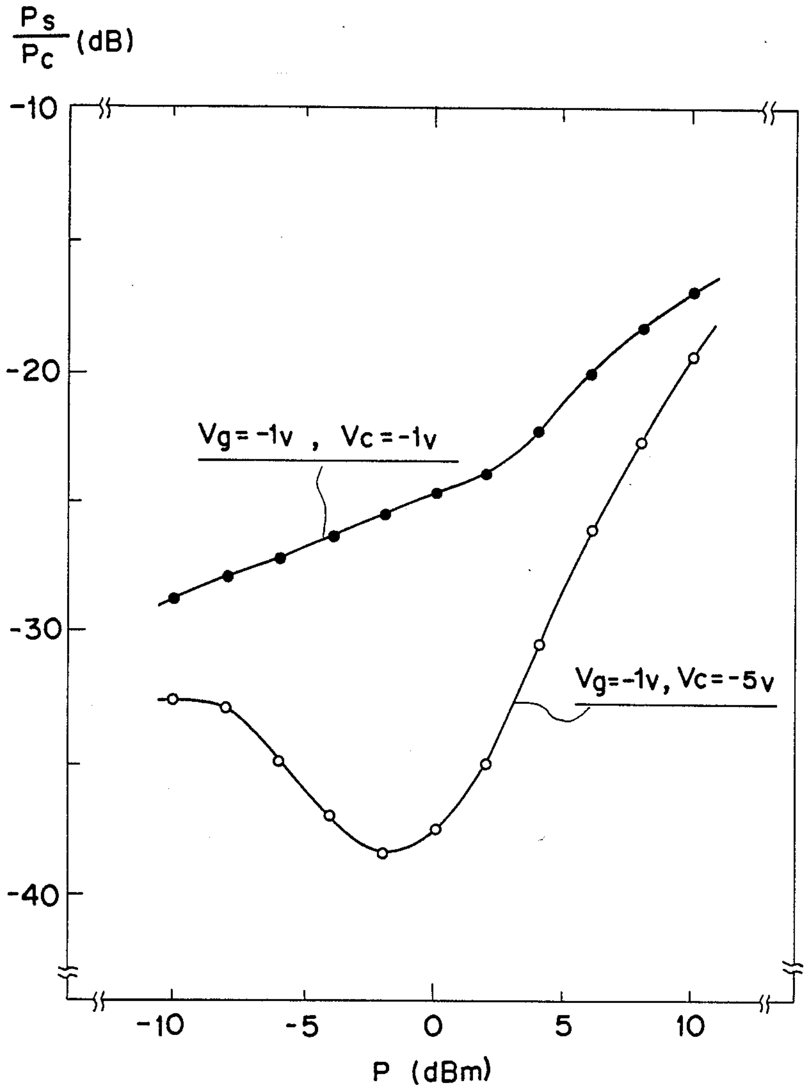
FIG. 4 is a graph showing measured characteristic curves of a SAW convolver according to this invention.

FIG. 4 shows an example of experimental results obtained by using the convolver according to this invention. The SAW element used for the experiment indicated in FIG. 4 has the same structure as that used for FIG. 3 except for the existence of the auxiliary electrodes. For example, the gate electrode is 15 mm long and each of the auxiliary electrodes is 2.3 mm long. FIG. 4 shows variations of the ratio of the self convolution output Ps to the convolution output Pc outputted from the gate electrode in the case where input signals having the same power are applied to the two I.D.Ts. In this case, the input signal is a Sezawa wave of 215 MHz. In FIG. 4, results obtained by varying the gate voltage Vg and the bias voltage Vc applied to the auxiliary electrodes are compared. As it can be seen from FIG. 3, a voltage of $-1V$ corresponds to the depletion or weakly inverted state of electrical potential of the semiconductor and a voltage of $-5V$ corresponds to the inverted state thereof. It can be understood from FIG. 4 that when a voltage to invert electrical potential of the semiconductor layer, is applied to the semiconductor layer, the self convolution level is lowered and that the degree of suppression of the self convolution signal to the convolution signal can be improved by more than several dB to 10 dB with respect to that obtained by using the prior art device.

As explained above, according to this invention, it is possible to suppress the self convolution signal by using a simple external circuit without modifying significantly the prior art structure.

Concrete material, of which each of the layers constituting the multi-layered structure of piezoelectric layer/insulating layer/semiconductor layer is made, is not at all restricted. For example, Si or GaAs may be used for the semiconductor layer and the insulating layer may be made of $SiO_2$ or $Si_3N_4$. Further, the piezoelectric layer may be made of ZnO, AlN, etc. However, it is advantageous that a structure of $ZnO/SiO_2/Si$ is used and the propagation mode of the surface acoustic wave is Sezawa wave for the purpose of increasing the convolution efficiency. In this case, it is specifically advantageous, when the facial orientation of Si is (110) and the propagation direction of the surface acoustic wave is [100], for which the electromechanical coupling constant of the surface acoustic wave is great. Since the electromechanical coupling constant is fairly great also when the facial orientation of Si is (100) and the propagation direction of the surface acoustic wave is [110], it can be said that the above conditions are secondly advantageous. Further, as stated previously, the fundamental operation of the element is possible, even if there is no insulating layer in the whole structure.

As explained above, according to this invention, it is possible to suppress the self convolution signal without modifying significantly the construction of the prior art SAW convolver.

What is claimed is:

1. A surface acoustic wave convolver, comprising:

a multi-layered structure which includes a piezoelectric layer and includes a semiconductor layer having a surface;

a pair of spaced input electrodes disposed on said piezoelectric layer;

a gate electrode which is disposed along a propagation path of surface acoustic waves in said piezoelectric layer at a location between said input electrodes and which extracts convolution signals from said convolver;

two auxiliary electrodes each disposed between said gate electrode and a respective one of said input electrodes; and means for applying to each said auxiliary electrode a bias voltage which causes portions of said surface of said semiconductor layer located below said auxiliary electrodes to be in an inverted state.

2. A surface acoustic wave convolver according to claim 1, wherein said semiconductor layer is made of Si.

3. A surface acoustic wave convolver according to claim 1, wherein said semiconductor layer is made of GaAs.

4. A surface acoustic wave convolver according to claim 1, wherein said piezoelectric layer is made of ZnO.

5. A surface acoustic wave convolver according to claim 1, wherein said piezoelectric layer is made of AlN.

6. A surface acoustic weave convolver according to claim 4, wherein the surface acoustic wave is a Sezawa wave.

7. A surface acoustic wave convolver according to claim 1, wherein said multi-layer structure includes an insulating layer provided between said piezoelectric layer and said semiconductor layer.

8. A surface acoustic wave convolver according to claim 7, wherein said insulating layer is made of $SiO_2$.

9. A surface acoustic wave convolver according to claim 1, wherein said input electrodes are interdigital electrodes.

10. A surface acoustic wave convolver according to claim 6, wherein said semiconductor layer is made of Si having a facial orientation of (110) and wherein the propagation direction of the surface acoustic wave is [100].

11. A surface acoustic wave convolver according to claim 6, wherein said semiconductor layer is made of Si having a facial orientation of (100) and wherein the propagation direction of the surface acoustic wave is [100].

12. A surface acoustic wave convolver according to claim 7, wherein said input electrodes, said gate electrodes and said auxiliary electrodes are provided on a side of said piezoelectric layer remote from said insulating layer and semiconductor layer, and including a ground electrode provided on a side of said semiconductor layer remote from said insultaing layer.

* * * * *

UNITED STATES PATENT AND TRADEMARK OFFICE
CERTIFICATE OF CORRECTION

PATENT NO. : 4 900 969

DATED : February 13, 1990

INVENTOR(S) : Syuichi MITSUTSUKA et al

It is certified that error appears in the above-identified patent and that said Letters Patent is hereby corrected as shown below:

Column 6, line 31; change "[100]" to ---[110]---.

Signed and Sealed this

Tenth Day of September, 1991

*Attest:*

HARRY F. MANBECK, JR.

*Attesting Officer*

*Commissioner of Patents and Trademarks*